(12) United States Patent
Seong et al.

(10) Patent No.: US 9,024,294 B2
(45) Date of Patent: May 5, 2015

(54) GROUP III NITRIDE NANOROD LIGHT EMITTING DEVICE

(71) Applicant: Samsung Electronics Co., Ltd., Suwon-si, Gyeonggi-do (KR)

(72) Inventors: Han Kyu Seong, Seoul (KR); Hun Jae Chung, Gyunggi-do (KR); Jung Ja Yang, Gyunggi-do (KR); Cheol Soo Sone, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 14/249,002

(22) Filed: Apr. 9, 2014

(65) Prior Publication Data

US 2014/0217361 A1 Aug. 7, 2014

Related U.S. Application Data

(63) Continuation of application No. 13/231,454, filed on Sep. 13, 2011, now Pat. No. 8,735,867.

(30) Foreign Application Priority Data

Sep. 14, 2010 (KR) ........................ 10-2010-0090117

(51) Int. Cl.
| | |
|---|---|
| *H01L 29/06* | (2006.01) |
| *H01L 31/00* | (2006.01) |
| *H01L 33/00* | (2010.01) |
| *H01L 33/04* | (2010.01) |
| *H01L 27/15* | (2006.01) |
| *H01L 33/16* | (2010.01) |

(Continued)

(52) U.S. Cl.
CPC .............. *H01L 33/04* (2013.01); *H01L 27/156* (2013.01); *H01L 33/08* (2013.01); *H01L 33/16* (2013.01); *H01L 33/24* (2013.01); *Y10S 977/816* (2013.01)

(58) Field of Classification Search
None
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |

(Continued)

FOREIGN PATENT DOCUMENTS

| CN | 101132028 A | 2/2008 |
| EP | 1 892 769 A2 | 2/2008 |
| WO | 2010-023921 A1 | 3/2010 |

OTHER PUBLICATIONS

Chinese Office Action, w/ English translation thereof, issued in Chinese Patent Application No. CN 201110281198.1 dated Nov. 5, 2013.

(Continued)

*Primary Examiner* — Michael Jung
(74) *Attorney, Agent, or Firm* — McDermott Will & Emery LLP

(57) ABSTRACT

There are disclosed a group III nitride nanorod light emitting device and a method of manufacturing thereof. The group III nitride nanorod light emitting device includes a substrate, an insulating film formed on the substrate, and including a plurality of openings exposing parts of the substrate and having different diameters, and first conductive group III nitride nanorods having different diameters, respectively formed in the plurality of openings, wherein each of the first conductive group III nitride nanorods has an active layer and a second conductive semiconductor layer sequentially formed on a surface thereof.

3 Claims, 8 Drawing Sheets

(51) Int. Cl.
    *H01L 33/08*           (2010.01)
    *H01L 33/24*           (2010.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,132,677 B2 | 11/2006 | Kim et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,521,274 B2 | 4/2009 | Hersee et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2008/0106887 A1 | 5/2008 | Salsbury et al. |
| 2010/0102033 A1 | 4/2010 | Choi et al. |
| 2010/0193768 A1 | 8/2010 | Habib |
| 2010/0252810 A1 | 10/2010 | Fuller et al. |
| 2011/0062416 A1 | 3/2011 | Wang et al. |
| 2011/0169025 A1 | 7/2011 | Kishino et al. |
| 2011/0175126 A1* | 7/2011 | Yang et al. .............. 257/98 |
| 2011/0233504 A1 | 9/2011 | Liu et al. |
| 2011/0309311 A1 | 12/2011 | So et al. |
| 2012/0097231 A1 | 4/2012 | Lee et al. |

OTHER PUBLICATIONS

Joachim, C., "To be nano or not to be nano?", 2005, Nature Materials 4, 107-109. Retrieved from internet on Sep. 1, 2013 at http://www.nature.com/nmat/journal/v4/n2/abs/nmat1319.html.
Li, S. et al., "GaN based nanorods for solid state lighting", Apr. 2, 2012, J. Appl. Phys. 111, 071101-1 to 071101-23.
Bergbauer, W. et al. in "Continuous-flux MOVPE growth of position-controlled N-face GaN nanorods and embedded InGaN quantum wells", Jul. 6, 2010, Nanotechnology 21, p. 305201 <<Retrieved at http://iopscience.iop.org/0957-4484/21/305201 on Feb. 5, 2013>>.
Chinese Office Action dated Jan. 27, 2015, issued in corresponding Chinese Application No. 201110281198.1.

* cited by examiner

GROUP III NITRIDE NANOROD LIGHT EMITTING DEVICE

CROSS-REFERENCE TO RELATED APPLICATIONS

This application is a Continuation of U.S. application Ser. No. 13/231,454, filed on Sep. 13, 2011, now U.S. Pat. No. 8,735,867 B2, which claims the priority of Korean Patent Application No. 10-2010-0090117 filed on Sep. 14. 2010, in the Korean Intellectual Property Office, the disclosures of which are incorporated herein by reference.

BACKGROUND OF THE INVENTION

1. Field of the Invention

The present invention relates to a group III nitride nanorod light emitting device, and more particularly, to a group III nitride nanorod light emitting device and a method of manufacturing thereof.

2. Description of the Related Art

In general, a nanorod made of a group III-N alloy (for example, GaN) has potential in the area of a new semiconductor device configuration, such as a nano scale optoelectronic device. For example, a GaN nanorod may provide a device operating under corrosive or high temperature conditions having chemical stability, a large bandgap, and a high melting point advantageous to the device. In addition, the larger bandgap of GaN and related alloys may allow for the manufacturing of a light source within a visible range advantageous to applications in display and illumination devices. Moreover, the unique geometric shapes of individual nanorods may have the potential to provide a new paradigm in the field of photonics and transfer devices.

SUMMARY OF THE INVENTION

An aspect of the present invention provides a group III nitride nanorod light emitting device capable of emitting light of various wavelengths by growing group III nitride nanorods having different diameters on the same substrate, and a method of manufacturing thereof.

According to an aspect of the present invention, there is provided a group III nitride nanorod light emitting device, including: a substrate; an insulating film formed above the substrate, and including a plurality of openings exposing parts of the substrate and having different diameters; and first conductive group III nitride nanorods having different diameters, respectively formed in the plurality of openings, wherein each of the first conductive group III nitride nanorods has an active layer and a second conductive semiconductor layer sequentially formed on a surface thereof.

The insulating film may include a plurality of groups, each including a plurality of openings having the same diameter, and the plurality of groups have different diameters.

The active layer may include at least a pair of a quantum barrier layer and a quantum well layer.

The quantum barrier layer may be formed of $Al_yGa_{1-y}N$ ($0 \leq y \leq 1$), and the quantum well layer may be formed of $In_xGa_{1-x}N$ ($0 \leq x \leq 1$).

The active layer formed on each of the first conductive group III nitride nanorods may have a content of indium (In) less than that of another active layer formed on another first conductive group III nitride nanorod having a smaller diameter.

The light emitting device including the first conductive group III nitride nanorods having different diameters may emit light of different wavelengths.

According to another aspect of the present invention, there is provided a method of manufacturing a group III nitride nanorod light emitting device, the method including: forming an insulating film including a plurality of openings exposing parts of a substrate and having different diameters on the substrate; growing first conductive group III nitride nanorods having different diameters in the openings; and sequentially forming an active layer and a second conductive semiconductor layer on a surface of each of the first conductive group III nitride nanorods.

The first conductive group III nitride nanorods may have diameters formed to be greater than those of the openings by 10% to 20%.

The active layer may include a quantum barrier layer formed of $AlyGa1-yN$($0 \leq y \leq 1$) and a quantum well layer formed of GaN.

The active layer formed on each of the first conductive group III nitride nanorods may have a content of indium (In) less than that of another active layer formed on another first conductive group III nitride nanorod having a smaller diameter.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
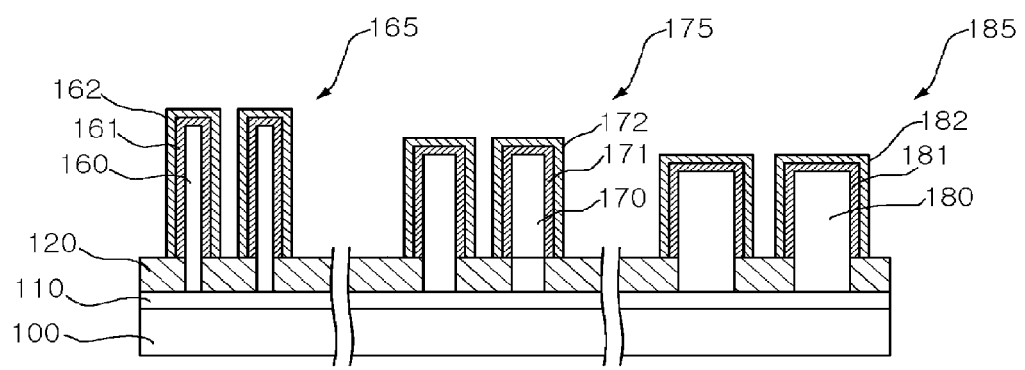
FIG. 1 is a cross sectional view of a group III nitride nanorod light emitting device including a plurality of group III nitride nanorods having different diameters according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. While those skilled in the art could readily devise many other varied embodiments that incorporate the teachings of the present invention through the addition, modification or deletion of elements, such embodiments may fall within the scope of the present invention.

The same or equivalent elements are referred to by the same reference numerals throughout the specification.

FIG. 1 is a cross sectional view of a group III nitride nanorod light emitting device including a plurality of group III nitride nanorods having different diameters according to an exemplary embodiment of the present invention. Referring to FIG. 1, the group III nitride nanorod light emitting device may include a substrate, a buffer layer, an insulating film, and a plurality of light emitting structures, respectively including group III nitride nanorods.

A substrate 100 is a growth substrate for growing a semiconductor single crystal, in particular, a nitride single crystal. The substrate 100 may be, for example, made of a material, such as a sapphire, silicon (Si), zinc oxide (ZnO), gallium arsenide (GaAs), silicon carbide (SiC), $MgAl_2O_4$, magnesium oxide (MgO), lithium aluminate ($LiAlO_2$), $LiGaO_2$, gallium nitride (GaN), or the like. The sapphire is a crystal having Hexa-Rhombo R3c symmetry, and has a C(0001)-plane, an A(1120)-plane, an R(1102)-plane, or the like. In this case, since the C-plane may be relatively facilitated for the growth of a nitride thin film, and stable at a high temperature, the C-plane may be mainly used for a substrate for growing a nitride semiconductor.

A buffer layer 110 is a nitride semiconductor layer, and may be made of a semiconductor material formed of $Al_xIn_yGa_{(1-x-y)}N$ ($0 \leq x \leq 1$, $0 \leq y \leq 1$, $0 \leq x+y \leq 1$) doped with impurities. For example, gallium nitride (GaN), aluminium gallium nitride (AlGaN), indium gallium nitride (InGaN), or the like may be used as the buffer layer 110. The buffer layer 110 may be formed of an n-type nitride semiconductor layer or a p-type nitride semiconductor layer according to the requirements thereof. Silicon (Si), germanium (Ge), selenium (Se), tellurium (Te) or the like may be used as n-type impurities, and magnesium (Mg), zinc (Zn), beryllium (Be) or the like may be used as p-type impurities.

The insulating film 120 may function to prevent contact between the n-type nitride semiconductor layer and the p-type nitride semiconductor layer of the nanorod light emitting device. In consideration of this function, the insulating film 120 may be made of a silicon oxide or a silicon nitride, for example, a silicon dioxide ($SiO_2$), a titanium dioxide ($TiO_2$), a silicon nitride ($Si_3N_4$) or the like. The height of the insulating film may be, for example, approximately 50 to 100 nm. The insulating film 120 may include a plurality of openings (not shown) exposing parts of the buffer layer 110. The plurality of openings have different diameters and may be patterned on the insulating film 120. The openings are means to designate a diameter, a length, a position of nanorods to be grown by a batch process. The openings may have various shapes, such as a quadrangle, a hexagon or the like, as well as being circular.

A plurality of light emitting structures 165, 175, and 185, respectively including first conductive group III nitride nanorods having different diameters are formed in the openings. The light emitting structures 165, 175, and 185 may include first conductive group III nitride nanorods 160, 170, and 180, active layers 161, 171, and 181, and second conductive semiconductor layers 162, 172, and 182.

The first conductive group III nitride nanorods 160, 170, and 180 may be formed of a single crystal, and may be made of n-GaN or p-GaN. The diameters of the first conductive group III nitride nanorods 160, 170, and 180 may be substantially proportional to diameters of the openings, and may be formed to be greater than those of the openings in which the first conductive group III nitride nanorods 160, 170, and 180 are formed, by approximately 10% to 20%. The length of the first conductive group III nitride nanorods 160, 170, and 180 may be adjusted by controlling time spent at a batch process temperature.

The active layers 161, 171, and 181 may be grown as a single crystal, in the same manner as the first conductive group III nitride nanorods 160, 170, and 180. The active layers 161, 171, and 181 may be grown to emit light having a predetermined energy by the light-emitting recombination of electrons and electron holes. The active layers 161, 171, and 181 may include at least a pair of a quantum barrier layer and a quantum well layer. The active layers 161, 171, and 181 may have a multiple quantum well structure. By way of example, the quantum barrier layer may be formed of $Al_yGa_{1-y}N$ ($0 \leq y \leq 1$), and the quantum well layer may be formed of $In_xGa_{1-x}N$ ($0 \leq x \leq 1$), whereby bandgap energy or light emitting wavelength may be adjusted depending on the content of indium (In).

The thickness of the second conductive semiconductor layers 162, 172, and 182 may be approximately 20 nm or more. When the first conductive group III nitride nanorods 160, 170, and 180 are n-type semiconductors, the second conductive semiconductor layers 162, 172, and 182 may be p-type semiconductor layers. While, when the first conductive group III nitride nanorods 160, 170, and 180 are p-type semiconductors, the second conductive semiconductor layers 162, 172, and 182 may be n-type semiconductor layers.

Figure 2A:
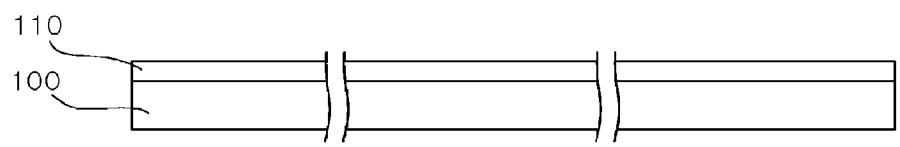
FIGS. 2A through 2C are diagrams showing a forming process of an insulating film including a plurality of openings having different diameters on a substrate according to an embodiment of the present invention.
Figure 2B:
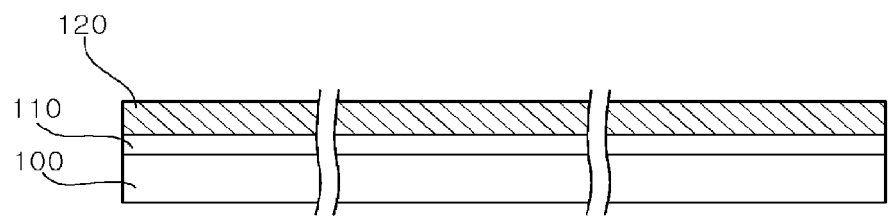
Figure 2C:
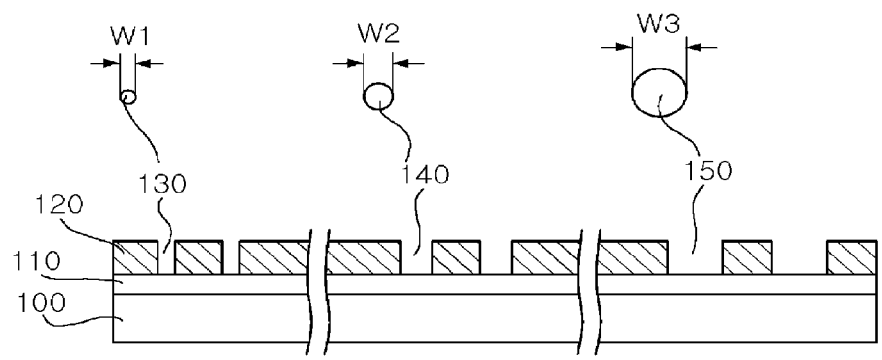

FIGS. 2A through 2C are diagrams showing a process of forming an insulating film including a plurality of openings having different diameters on a substrate according to an embodiment of the present invention.

Referring to FIG. 2A, the buffer layer 110 maybe formed on the substrate 100. The buffer layer 110 may be grown by a process, such as a metal organic chemical vapor deposition (MOCVD), a molecular beam epitaxy (MBE), a hydride vapor phase Epitaxy (HVPE) or the like. By way of example, a C(0001)-plane sapphire substrate is prepared in a reactor within a MOCVD apparatus to apply heat thereto, thereby allowing for the deposition of the buffer layer 110, a n-GaN semiconductor layer on the substrate at a temperature of about 1080° C.

Referring to FIGS. 2B through 2C, the insulating film 120 may be formed on the buffer layer 110. A plurality of patterned openings 130, 140, and 150 exposing parts of the buffer layer 110 may be formed in the insulating film 120. The patterned openings 130, 140, and 150 may be formed in the insulating film 120 by etching the insulating film 120 through a lithography process. By way of example, the openings 130, 140, and 150 having different diameters may be formed in the insulating film 120 in such a manner as to have certain diameters W1, W2 and W3 and distances therebetween. The respective diameters W1, W2 and W3 of the openings 130, 140, and 150 shown in FIG. 1C are in accordance with the order in size of W1<W2<W3.

Figure 3:
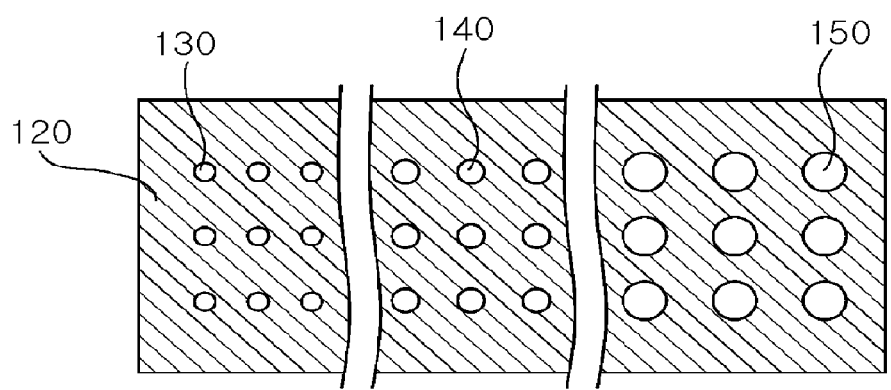
FIG. 3 is a plan view of the insulating film including the plurality of openings having different diameters formed therein.

FIG. 3 is a plan view of the insulating film including the plurality of openings having different diameters formed therein. Referring to FIG. 3, the insulating film 120 may include a plurality of groups, each including a plurality of openings having the same diameter, and the plurality of groups may have different diameters. The openings 130, 140, and 150 are means to designate a diameter, a length, and a position of the nanorods to be grown by a batch process. The openings 130, 140, and 150 may have various shapes, such as a quadrangle, a hexagon or the like, as well as being circular.

Figure 4A:
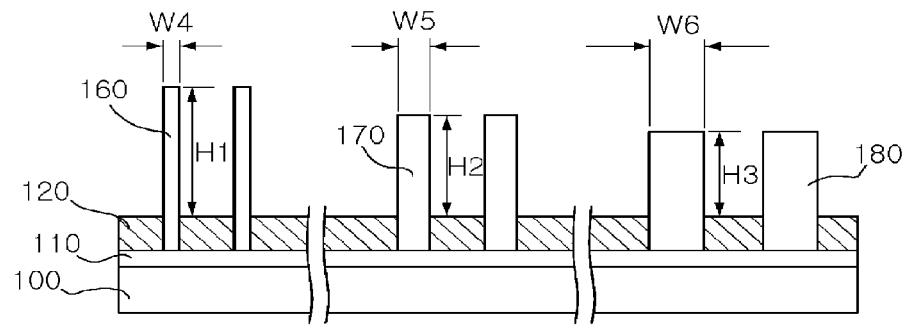
FIGS. 4A through 4C show a process of manufacturing a group III nitride nanorod light emitting device in which nanorods are provided in an insulating film including a plurality of openings having different diameters, according to an exemplary embodiment of the present invention.
Figure 4B:
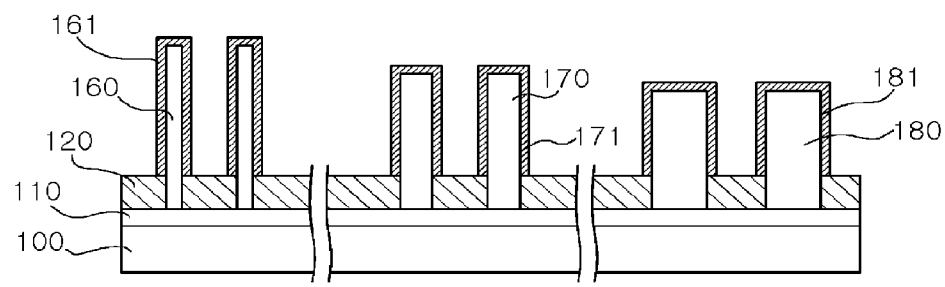
Figure 4C:
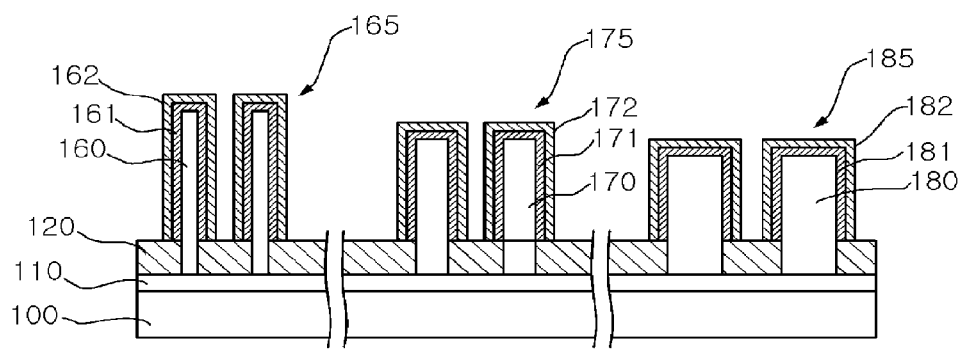

FIGS. 4A through 4C show a process of manufacturing a group III nitride nanorod light emitting device in which nanorods are provided in an insulating film including a plurality of openings having different diameters, according to an exemplary embodiment of the present invention.

Referring to FIG. 4A, the respective first conductive group III nitride nanorods may be grown to a height of the insulating film 120 on the buffer layer 110 exposed by the plurality of openings of the insulating film 120. In the process, byway of example, while a temperature in the reactor equipped with the substrate 100 may be maintained at approximately 900° C. to 1100° C. and a gallium source, trimethyl gallium (TMGa) of about 10 sccm to 200 sccm and an ammonia ($NH_3$) gas of 15000 sccm to 20000 sccm are scattered, the respective first conductive group III nitride nanorods may be deposited to the height of the insulating film 120, that is, approximately 50 to 100 nm at a temperature of approximately 1000° C. to 1100° C. for about 1 min to 5 min.

After the first conductive group III nitride nanorods are grown to the height of the insulating film 120, the flow rate of the gallium source, TMGa, may be reduced to approximately 50 to 150 sccm and the flow rate of ammonia (NH3) gas may be reduced to approximately 500 to 5000 sccm, and the first conductive group III nitride nanorods 160, 170, and 180 may be grown at approximately 900 to 1100. At this time, the internal pressure of the reactor may be maintained to approximately 70 mbar to 200 mbar.

The respective diameters of the first conductive group III nitride nanorods 160, 170, and 180, the growths of which have been completed on the substrate 100, are in accordance with the order of W4<W5<W6. However, the respective heights of the first conductive group III nitride nanorods 160, 170, and 180 are in accordance with the order of H1>H2>H3. Therefore, the diameters and the heights thereof may be in inverse proportion.

Figure 5A:
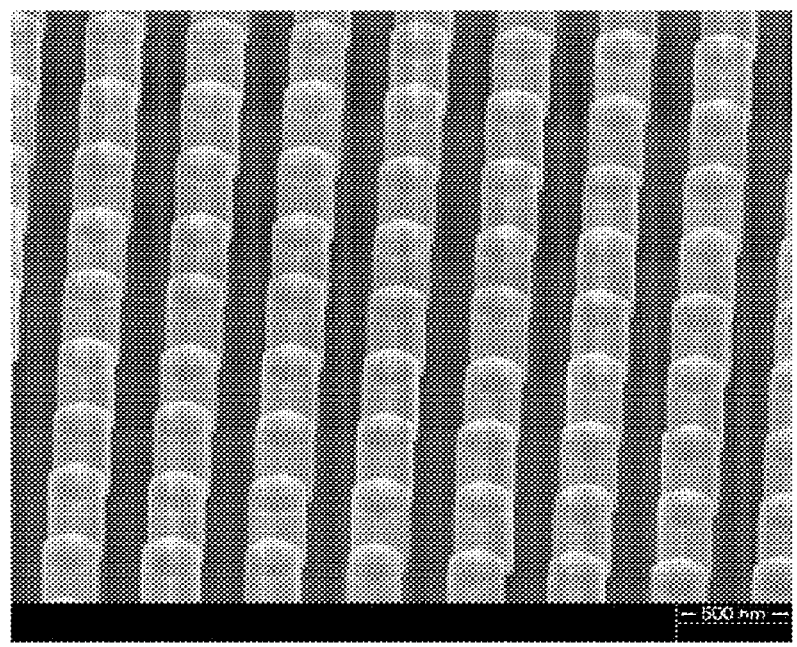
FIGS. 5A through 5C are scanning electron microscope (SEM) micrographs of first conductive group III nitride nanorods, the growths of which have been completed, according to an exemplary embodiment of the present invention.
Figure 5B:
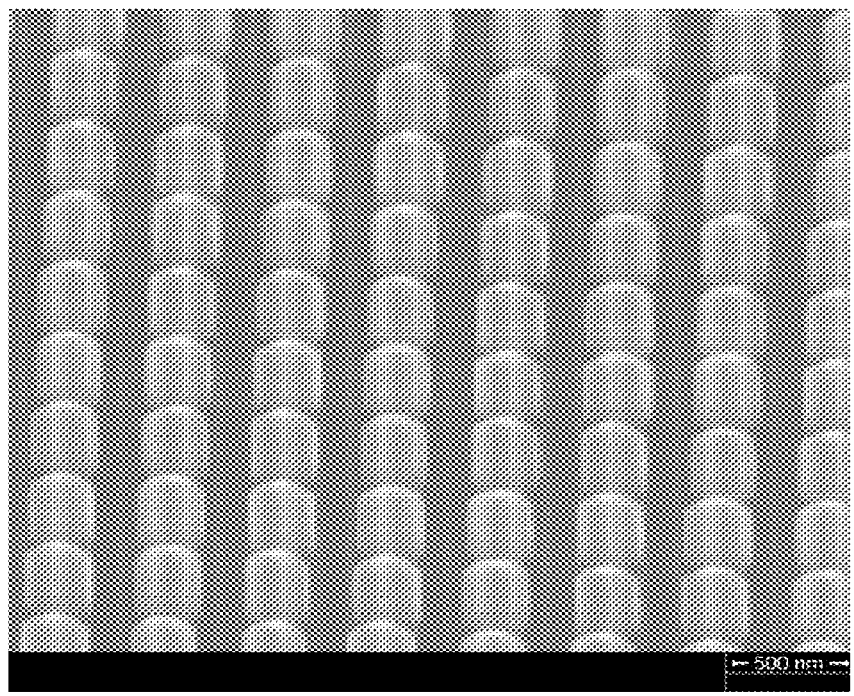
Figure 5C:
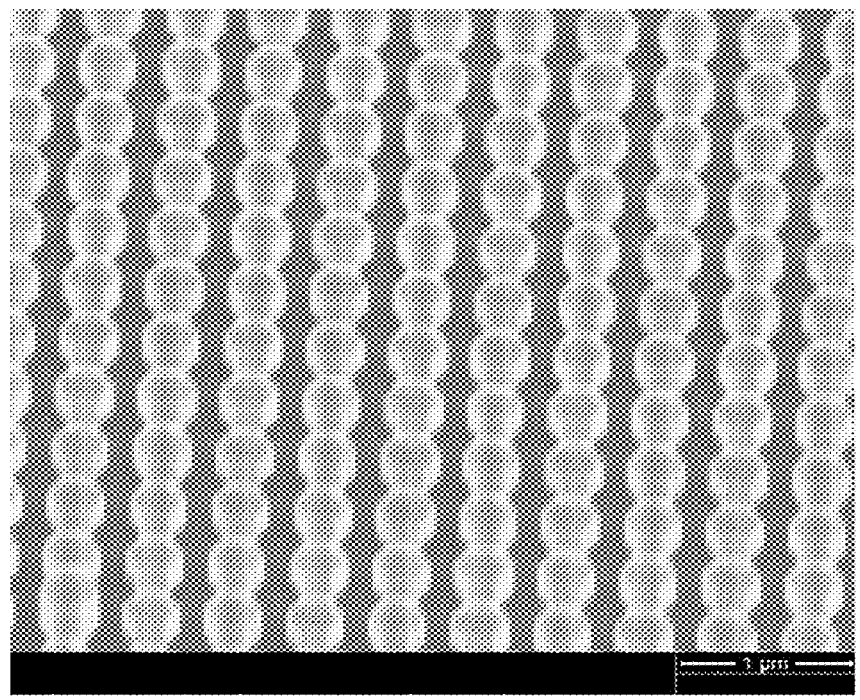

FIGS. 5A through 5C are scanning electron microscope (SEM) micrographs of first conductive group III nitride nanorods, the growths of which have been completed, according to an exemplary embodiment of the present invention. Referring to FIGS. 5A through 5C, while the diameters of the first conductive group III nitride nanorods are in accordance with the order in size of FIG. 5A<FIG. 5B<FIG. 5C, the heights of the first conductive group III nitride nanorods are in accordance with the order of FIG. 5A>FIG. 5B>FIG. 5C. The lengths of the first conductive group III nitride nanorods may be adjusted by controlling time spent at the batch process temperature.

According to the exemplary embodiment of the present invention, when the patterned openings of the insulating film have diameters in the range of approximately 100 to 180 nm, the grown first conductive group III nitride nanorods have diameters in the range of approximately 120 to 200 nm. When the patterned openings of the insulating film have diameters in the range of approximately 180 to 250 nm, the grown first conductive group III nitride nanorods have diameters in the range of approximately 200 to 280 nm. When the patterned openings of the insulating film have diameters in the range of approximately 250 to 400 nm, the grown first conductive group III nitride nanorods have diameters in the range of approximately 280 to 450 nm. Therefore, it can be confirmed that the diameters of the first conductive group III nitride nanorods may be substantially proportional to the diameters of the patterned openings, and the diameters of the nanorods may be formed to be larger than those of the patterned openings by approximately 10% to 20%.

Referring to FIG. 4B, the active layers 161, 171, and 181 are formed on the surfaces of the first conductive group III nitride nanorods 160, 170, and 180 formed above the substrate 100 on which the buffer layer 110 and the insulating film 120 are sequentially stacked. In an exemplary embodiment, the formation of the active layers 161, 171, and 181 may be performed at a temperature lower than the formation temperature of the first conductive group III nitride nanorods 160, 170, and 180 by approximately 100° C. to 300° C.

Referring to FIG. 4C, the second conductive semiconductor layers 162, 172, and 182 may be formed on the active layers 161, 171, and 181 so as to cover the entire surfaces of the active layers 161, 171, and 181.

Figure 6:
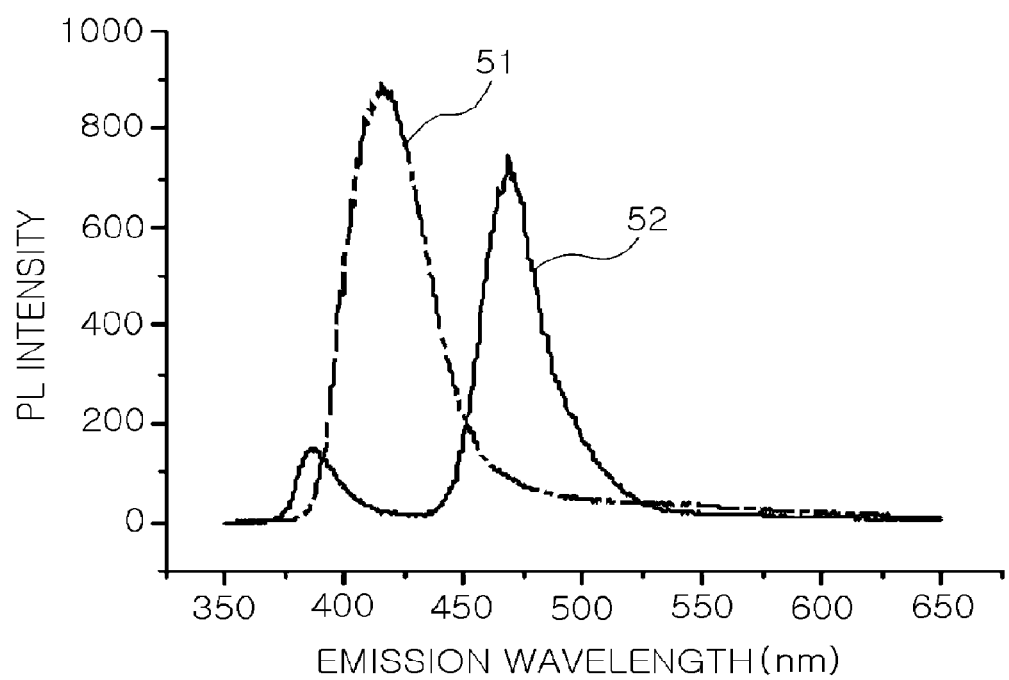
FIG. 6 is a graph showing PL properties of a group III nitride nanorod light emitting device including light emitting structures having different diameters, according to an exemplary embodiment of the present invention.

FIG. 6 is a graph showing PL properties of a group III nitride nanorod light emitting device including light emitting structures having different diameters, according to an exemplary embodiment of the present invention. After n-GaN nanorods having different diameters were formed, active layers having five pairs of InGaN/GaN were formed thereon, and then p-GaN layers were formed thereon, whereby nanorod light emitting structures were formed. The PL properties of the nanorod light emitting structures having different diameters and grown under the same growth condition are shown in FIG. 6. Referring to FIG. 6, in the case of a nanorod light emitting structure 51 having a larger diameter, it shows an emission wavelength shorter than that of a nanorod light emitting structure 52 having a smaller diameter. Thus, it can be confirmed that the content of In contained in the active layer of the nanorod light emitting structure having a larger diameter is less than that of the nanorod light emitting structure having a smaller diameter. As a result, it can be seen that the content of In contained in the nanorod light emitting structures grown under the same conditions may be increased, as the diameter of nanorods is reduced. It can be confirmed that the variation range of the PL wavelength may be changed in the range of 420 to 480 nm, as the diameter of the patterns is changed within the range of 200 to 400 nm.

As set forth above, according to exemplary embodiments of the invention, there are provided a group III nitride nanorod light emitting device capable of emitting light of various wavelengths by growing group III nitride nanorods having different diameters on the same substrate, and a method of manufacturing thereof.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a group III nitride nanorod light emitting device, the method comprising:
   forming a first conductive semiconductor layer on a substrate forming an insulating film including openings exposing parts of the first conductive semiconductor layer;
   growing first conductive group III nitride nanorods, respective diameters of the first conductive group III nitride nanorods being 120 nm or greater; and
   forming light emitting structures by sequentially forming an active layer and a second conductive semiconductor layer on a surface of each of the first conductive group III nitride nanorods such that the active layer is positioned on a side surface of the first conductive group III nitride nanorod,
   wherein the light emitting structures are divided into at least two groups including a first group on a first area of the first conductive semiconductor layer and a second group on a second area of the first conductive semiconductor layer, each group including two or more light emitting structures that have substantially identical diameters and substantially identical heights, wherein the diameter of the light emitting structures of the first group is smaller than the diameter of the light emitting structures of the second group and an active layer of the second group emits second light having a different wavelength from that of the first light emitted by an active layer of the first group, and wherein the active layer of the second group has an indium (In) content smaller than that of the active layer of the first group.

2. The method of claim 1, wherein the substrate comprises a material selected from the group consisting of a sapphire, silicon (Si), zinc oxide (ZnO), gallium arsenide (GaAs), silicon carbide (SiC), $MgAl_2O_4$, magnesium oxide (MgO), lithium aluminate ($LiAlO_2$), $LiGaO_2$ and gallium nitride (GaN).

3. The method of claim 1, wherein the substrate is a sapphire substrate having a C(0001)-plane, an A(1120)-plane, or an R(1102)-plane.

* * * * *